US 6,727,156 B2

United States Patent
Jung et al.

(10) Patent No.: US 6,727,156 B2
(45) Date of Patent: Apr. 27, 2004

(54) SEMICONDUCTOR DEVICE INCLUDING FERROELECTRIC CAPACITOR AND METHOD OF MANUFACTURING THE SAME (75) Inventors: Dong-jin Jung, Kyungki-do (KR); Ki-nam Kim, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/924,206

(22) Filed: Aug. 7, 2001

(65) Prior Publication Data
US 2002/0024074 A1 Feb. 28, 2002

(30) Foreign Application Priority Data

Aug. 25, 2000 (KR) ........................................ 2000-49623

(51) Int. Cl.$^7$ ............................................. H01L 21/20
(52) U.S. Cl. ...................... 438/396; 438/3; 438/240; 257/295; 257/310
(58) Field of Search ................... 257/295, 298, 257/303, 310; 438/3, 396, 250, 381, 686, 240

(56) References Cited

U.S. PATENT DOCUMENTS

| | | | |
|---|---|---|---|
| 5,851,841 A | * 12/1998 | Ushikubo et al. | 438/240 |
| 6,133,050 A | * 10/2000 | Azuma et al. | 438/3 |
| 6,287,637 B1 | * 9/2001 | Chu et al. | 427/376.2 |
| 6,313,539 B1 | * 11/2001 | Yokoyama et al. | 257/761 |
| 6,337,238 B1 | * 1/2002 | Nakabayashi | 438/240 |
| 6,376,325 B1 | * 4/2002 | Koo | 438/396 |
| 6,388,281 B1 | * 5/2002 | Jung et al. | 257/295 |
| 6,472,229 B1 | * 10/2002 | Aoki et al. | 438/3 |
| 6,503,792 B2 | * 1/2003 | Hartner et al. | 438/240 |
| 6,515,323 B1 | * 2/2003 | Jung et al. | 257/295 |
| 2001/0007364 A1 | * 7/2001 | Kondo et al. | 257/295 |
| 2001/0007366 A1 | * 7/2001 | Kim et al. | 257/306 |
| 2001/0031505 A1 | * 10/2001 | Arita et al. | 438/3 |
| 2002/0142489 A1 | * 10/2002 | Matsuura et al. | 438/3 |
| 2002/0177243 A1 | * 11/2002 | Matsuura et al. | 438/3 |

FOREIGN PATENT DOCUMENTS

| | | |
|---|---|---|
| JP | 10027888 | 1/1998 |
| JP | 10173138 | 5/1999 |
| KR | 1996-0061252 | 12/1996 |

OTHER PUBLICATIONS

H.N. Al–Shareef, et al.; "Electrical properties of ferroelectric thin film capacitors with hybrid (Pt,RuO$_2$ electrodes for nonvolatile memory applications"; J. Appl. Phys. 77 (5), Mar. 1, 1995, 1995 American Institute of Physics; pp. 2146–2148; 2146–2154.

(List continued on next page.)

Primary Examiner—George Eckert
Assistant Examiner—José R. Diaz
(74) Attorney, Agent, or Firm—Marger Johnson & McCollom, P.C.

(57) ABSTRACT

A method of manufacturing a semiconductor device including a ferroelectric capacitor is provided. A conductive plug is formed in a first insulating layer on a semiconductor substrate. A first lower metal layer is formed overlying the conductive plug. A lower metal oxide layer is formed on the first lower metal layer. A second lower metal layer is formed on top of the lower metal oxide layer. A ferroelectric layer is formed from a ferroelectric material on the lower electrode layer at a crystallizing temperature of approximately 700° C. A first upper metal layer is formed on top of the ferroelectric layer. Thereafter, a heat treatment higher than the crystallizing temperature is performed. An upper metal oxide layer is formed on top of the first upper metal layer. A second upper metal layer is formed on top of the upper metal oxide layer.

16 Claims, 8 Drawing Sheets

OTHER PUBLICATIONS

T. Nakamura, et al.; "Preparation of Pb(Zr,Ti)O$_3$ Thin Films on Ir and IrO$_2$ Electrodes"; Jpn. J. Appl. Phys, vol. 33 (1994); Pt. 1 No. 9B; Sep. 1994; pp. 5207–5210.

R. Ramesh, et al.; "Scaling of ferroelectric properties in La–Sr–Co–O/Pb–La–Zr–Ti–O/La–Sr–Co–O capacitors"; Appl. Phys. Lett., vol. 64., No. 12, Mar. 21, 1994; pp. 1588–1590.

S.Y. Lee, D.J. Jung, et al.; "A FRAM technology using 1T1C and triple metal layers for high performance and high density FRAMs"; 1999 Symposium on VLSI Technology Digest of Technical Papers; pp. 141–142.

English language abstract of Japanese Patent No. 10–27888.

English language abstract of Japanese Patent No. 10173138.

English language abstract of Korean Patent No. 1996–0061252.

* cited by examiner

SEMICONDUCTOR DEVICE INCLUDING FERROELECTRIC CAPACITOR AND METHOD OF MANUFACTURING THE SAME

This application relies for Priority upon Korean Patent Application No.2000-49623, filed on Aug. 25, 2000, the contents of which are the herein incorporated by the reference in their entirety.

BACKGROUND OF THE INVENTION

1. Field of the Invention

The present invention relates to a semiconductor device, and more particularly, to a semiconductor device including a ferroelectric capacitor having an improved retention property and manufacturing method thereof.

2. Description of the Related Art

A semiconductor device including a ferroelectric capacitor such as a ferroelectric random access memory (FRAM) device enables high-speed read and write operations with a polarization inversion characteristic and remnant polarization of a ferroelectric layer.

With the polarization inversion of a ferroelectric layer resulting from rotation of dipoles, the FRAM device is known to have operational speed of $10^4$ to $10^6$ times faster than other non-volatile memory devices such as electrically erasable programmable read-only memory (EEPROM) or flash memory devices. Furthermore, by miniaturization and optimum design concept introduced into the FRAM device, it is known that the FRAM device can obtain write operation speed in hundreds to tens of nanoseconds (ns), thereby allowing for high-speed operation comparable to dynamic random access memory (DRAM). The FRAM device typically requires 2–5 V for polarization inversion, and thus lower voltage single power operation is possible compared to the EEPROM or flash memory requiring a high voltage of 18–22V for a write operation.

The characteristics of the FRAM device is significantly affected by the characteristics of a ferroelectric capacitor. The ferroelectric capacitor characteristics are in turn significantly influenced by the structure of a ferroelectric layer and an electrode used in the capacitor.

The ferroelectric thin films are largely classified into SrBi2Ta2O9 (SBT) films and Pb(Zr1–xTix)O3 (PZT) films. The SBT films having a relatively small remnant polarization value Pr, i.e. 5–10 C/cm$^2$, is not ideal for the cell structure of one-Transistor and one-Capacitor ("1T1C") typically required in a memory device.

Furthermore, the deposition temperature of the SBT films is about 800–850° C. The characteristics of Complementary Metal-Oxide-Semiconductor (CMOS) underlying the SBT film may be affected by such high deposition temperature.

On the other hand, the PZT films are known to be suitable for the cell structure of 1T1C for a highly integrated ferroelectric memory device because they have a relatively large remnant polarization value Pr, i.e. greater than 30 µC/cm2 (S. Y. LEE, 1999, "A FRAM Technology Using 1T1C and Triple Metal Layer for High Performance and High Density FRAMs", Symposium on VLSI Technology Digest of Technical Papers, p141). Furthermore, because the deposition temperature is 600–700° C., the characteristics of the CMOS integrated under the PZT film are relatively less affected by the deposition temperature. Thus, effort has been recently made to actively apply the PZT film to ultra highly integrated ferroelectric memory devices made (R. Ramesh et al., Mar. 21, 1994, "Scaling of Ferroelectric Properties in La—Sr—Co—O/Pb—La—Zr—Ti—O/La—Sr—Co—O Capacitors', Appl. Phys. Lett., Vol. 64, No. 12).

Two main properties that ferroelectric capacitors are desirable to have as a non-volatile memory device may be endurance property and retention property. The endurance property refers to resistance against data destruction due to repetitions of read/write operations, and the retention property refers to how long stored data can be retained. In order to improve the retention property, use of a metal oxide electrode as a capacitor electrode in adopting PZT to a capacitor is proposed (H. N. Al-Shareef et al., Mar. 1, 1995, "Electrical Properties of Ferroelectric Thin Film Capacitors with Hybride (Pt, RuO2) for Nonvolatile Memory Applications", J. Appl. Phys., 77(5), pp. 2146–2154; Takashi Nakamura et al., 1994, "Preparation of Pb(Zr,Ti)O3 Thin Film on Ir and IrO2 Electrodes", Jpn. J. Appl. Phys. Vol. 33, 1994, Pt1. No. 9B, pp. 5207–5210).

However, with the metal oxide electrode as capacitor electrode significant improvement in the retention property and preventing degradation in the endurance property at the same time are difficult to attain. This is because a high density of interface defects may be caused by instability at the interface between the metal oxide electrode and the PZT film. Thus a large quantity of space charges may occur at the interface. This could result in the compensation and reduction of non-volatile remnant polarization induced by dipole, and eventually may degrade the retention property.

Furthermore, the metal oxide electrode is difficult to be implemented in a capacitor over bit line (COB) structure. In line with a current tendency of using the COB structure for high integration and large storage capacity of a semiconductor device, attempts to adopt the COB structure is made in FRAM devices. However, with the metal oxide electrode, an undesired oxide layer can be formed between a conductive plug for electrically connecting a lower electrode of a capacitor with underlying active region of a semiconductor substrate, and the lower electrode. The undesired oxide layer may degrade the characteristics of a capacitor.

SUMMARY OF THE INVENTION

To solve the above problems, it is an objective of the present invention to provide a semiconductor device having a ferroelectric capacitor capable of improving endurance and retention properties, and manufacturing method thereof.

Accordingly, to accomplish the above objective, the present invention provides a method of manufacturing a semiconductor device having a ferroelectric capacitor in which upper and lower electrodes have a triple layered structure of metal layer/metal oxide layer/metal layer. Specifically, a conductive plug electrically connected to a semiconductor substrate is formed by penetrating through an insulating layer on the semiconductor substrate. A first lower metal layer that is electrically connected to the conductive plug and prevents diffusion of oxygen into the conductive plug is formed on the insulating layer. A conductive lower metal oxide layer is formed on the first lower metal layer. A second lower metal layer for inducing interface lattice matching is formed on top of the lower metal oxide layer to form a lower electrode layer comprised of the first lower metal layer, the lower metal oxide layer, and the second lower metal layer.

A ferroelectric layer is formed on the lower electrode layer, and a first upper metal layer for inducing interface lattice matching is formed on top of the ferroelectric layer formed of a ferroelectric material. After having formed the first upper metal layer, a heat treatment is performed above the crystallization temperature of the ferroelectric material to induce interface lattice matching at the interfaces between the first upper metal layer and the ferroelectric layer, and between the second lower metal layer and the ferroelectric layer. A conductive upper metal oxide layer is formed on top of the first upper metal layer. A second upper metal layer for preventing diffusion of a material on top of the upper metal oxide layer is formed on the upper metal oxide layer to form an upper electrode layer comprised of the first upper metal layer, the upper metal oxide layer, and the second upper metal layer. After forming an upper insulating layer on top of the upper electrode layer, the upper insulating layer is penetrated to form a wire electrically connected to the upper electrode layer.

Here, an adhesive layer formed of a titanium layer underlies the first lower metal layer. The first lower metal layer and the second upper metal layer are preferably formed of iridium, and the lower metal oxide layer and the upper metal oxide layer are preferably formed of iridium oxide. The second lower metal layer and the first upper metal layer are preferably formed of platinum, and the ferroelectric layer is preferably formed of $Pb(Zr_{1-x}Ti_x)O_3$ (PZT). The heat treatment for inducing the interface lattice matching is performed in the range of approximately 725–800° C. in an oxygen ambient.

According to the invention described above, a semiconductor device having a ferroelectric capacitor that is capable of significantly improving read/write endurance and retention characteristics.

BRIEF DESCRIPTION OF THE DRAWINGS

The above objectives and advantages of the present invention will become more apparent by describing in detail a preferred embodiment thereof with reference to the attached drawings in which.

DETAILED DESCRIPTION OF THE INVENTION

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the shape of elements is exaggerated for clarity, and the same reference numerals in different drawings represent the same element. Further, it will be understood that when a layer is referred to as being "on" another layer or substrate, it can be directly on the other layer or substrate, or intervening layers may also be present.

Figure 1:
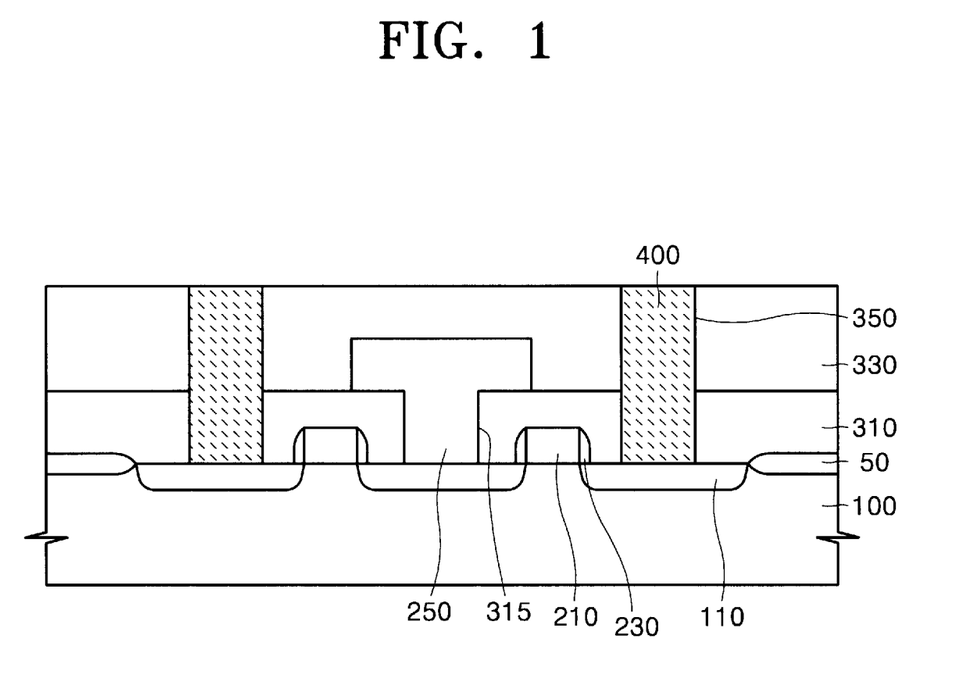
FIGS. 1–7 are cross-sectional views for explaining a semiconductor device having a ferroelectric capacitor according to an embodiment of the invention, and manufacturing method thereof.

FIG. 1 schematically shows a step of forming a conductive plug electrically connected to a semiconductor substrate 100. Specifically, an active region 110 and an isolation region 50 are defined on a semiconductor substrate 100. A transistor is formed including a gate 210 used as a word line on the active region 110. A spacer 230 may be further formed on the side walls of the gate 210. Next, after a first insulating layer 310 of an insulating material, such as silicon oxide, is formed overlying the gate 210, a first contact hole 315 is formed to expose the active region 110 adjacent to the gate 210 by a photolithographic process. A conductive layer for filling the first contact hole 315 is formed on the first insulating layer 310 and patterned to form a bit line 250.

After forming a second insulating layer 330 overlying the bit line 250 by depositing an insulating material, the second insulating layer 330 is patterned to form a second contact hole 350 therein to expose the active region 110 of the semiconductor substrate 100. Then, a conductive plug 400 is formed within the second contact hole 350. The conductive plug 400 may be formed of various conductive materials, e.g., doped polysilicon. The conductive plug 400 electrically connects a lower electrode of a capacitor with the active region 110 of the semiconductor substrate 100 in a capacitor-over-bit line (COB) structure.

Figure 2:
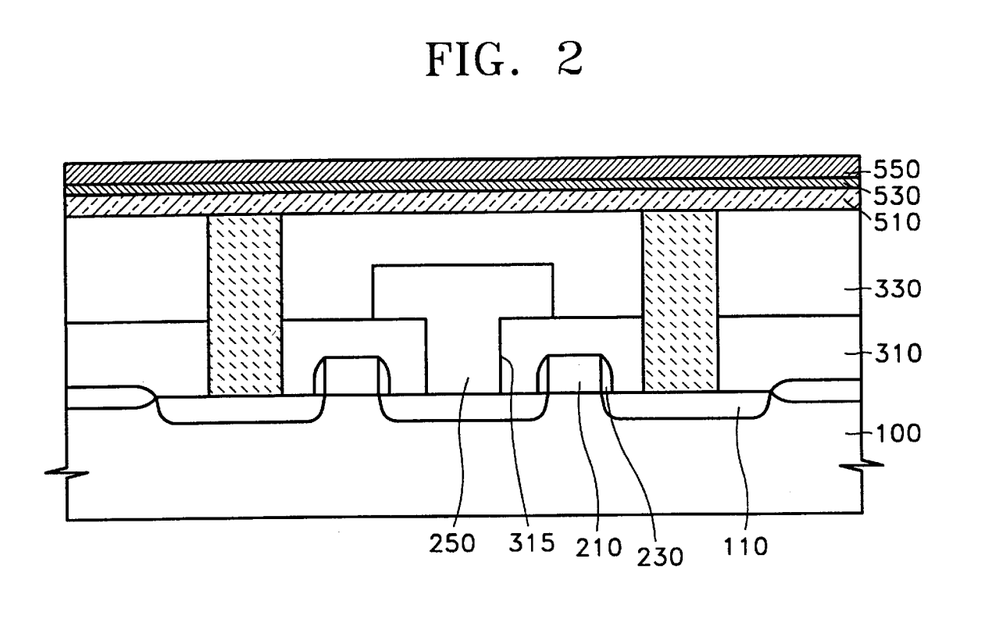

FIG. 2 schematically shows a step of forming lower electrode layers on the second insulating layer 330. Specifically, a noble metal such as iridium (Ir) is deposited over the second insulating layer 330 to form a first lower metal layer 510. If iridium is used as the noble metal, it is formed to a thickness of approximately 1,500 Å, preferably by DC magnetron sputtering. The first metal layer 510 made of iridium serves both as a barrier layer for preventing diffusion of oxygen into the underlying conductive plug 400, and as an ohmic contact at an interface with the conductive plug 400.

The first lower metal layer 510 may be formed of a durable metal other than iridium, such as rhenium (Re), ruthenium (Ru) or rhodium (Rh). However, considering its role as a barrier layer for preventing the diffusion of oxygen into the conductive plug 400, it is preferable to form the first lower metal layer 510 of iridium. This is because iridium is known to have relatively low oxygen permeability compared with Ru or Rh, and thus it has a relatively excellent diffusion barrier characteristic.

Before forming the first lower metal layer 510, an adhesive layer (not shown) in contact with the conductive plug 400 may be further formed. A titanium (Ti) layer may be used as the adhesive layer, and the titanium layer may be deposited to a thickness of about 50 Å, preferably by sputtering. A lower metal oxide layer 530 is formed on top of the first lower metal layer 510. The lower metal oxide layer 530 may be formed of a conductive metal material such as Iridium oxide (IrO2). The iridium oxide layer may be deposited to a thickness of approximately 500 Å preferably by a DC magnetron sputtering technique. The lower metal oxide layer 530 may be heat treated in an oxygen ambient for stability of the iridium oxide layer. For example, a rapid thermal anneal (RTA) process may be performed at approximately 550° C. for 1 minute.

When oxygen vacancies occur at the interface with a ferroelectric layer formed in a subsequent step, the iridium oxide layer compensates the oxygen vacancies. This can be proved by a widely-known fact that the iridium oxide layer has a relatively unstable state. The read/write endurance can be improved by introducing the lower metal oxide layer 530 such as the iridium oxide layer. This is because the lower metal oxide layer 530 compensates the oxygen vacancies occurring at the interface with the ferroelectric layer.

The lower metal oxide layer may be formed of a conductive metal oxide other than the iridium oxide, such as rhenium oxide (ReO2), ruthenium oxide (RuO2), or rhodium oxide (RhO2). However, as described above, it is preferable to use the iridium oxide layer as the lower metal oxide layer 530 since it has a relatively unstable state to effectively compensate the oxygen vacancies.

For a subsequent process, a second lower metal layer 550 is formed on top of the lower metal oxide layer 530 for providing stability in a crystal growth of a ferroelectric layer to be formed thereon. The second lower metal layer 550 induces interface lattice matching, using an underlayer dependence characteristic of the ferroelectric layer to be formed thereon. If a lattice mismatch seriously occurs at the interface between the second lower metal layer 550 and the ferroelectric layer to be formed thereon, a high density of interface states may be generated at the interface.

The interface states are believed to occur due to instability of interfaces, and work in trap states caused by the difference of a work function between a material for the underlying layer and a ferroelectric material, e.g., Pb(Zr1−xTix)O3 (PZT), and dangling bonds between atoms at the interface. The interface states may generate space charges, and in turn the generated space charges may reduce non-volatile remnant polarization produced by dipoles. As a result, the retention property can be degraded.

In order to prevent generation of space charges at the interface, an embodiment of the invention proposes to use a material with a good interface lattice match to a ferroelectric layer such as a PZT film as the second lower metal layer 550. For example, interface lattice matching with the ferroelectric layer such as the PZT film may be achieved by using a platinum layer as the second lower metal layer 550. In this case, the second lower metal layer 550 may be implemented with deposition of platinum by sputtering to a thickness of approximately 1,500 Å.

The platinum is known to have a lattice parameter and a crystal lattice structure of face centered cubic (fcc) similar to a ferroelectric material such as PZT. Thus, the crystal lattice structure of PZT on the platinum layer can be grown with a good interface lattice match or relatively good interface coherence. Thus, it can suppress the occurrences of interface states at the interface between the second lower metal layer 550 and the ferroelectric layer due to an interface lattice mismatch. Furthermore, since the platinum has a relatively high work function value of approximately 5.4–5.7 eV and hence the difference in work function values between the ferroelectric layer and the platinum layer is relatively small, the occurrences of interface states can be minimized. Accordingly, degradation of the retention property can be avoided. A lower electrode layer of a capacitor is formed with a structure of the first lower metal layer 510/lower metal oxide layer 530/second lower metal layer 550.

Figure 3:
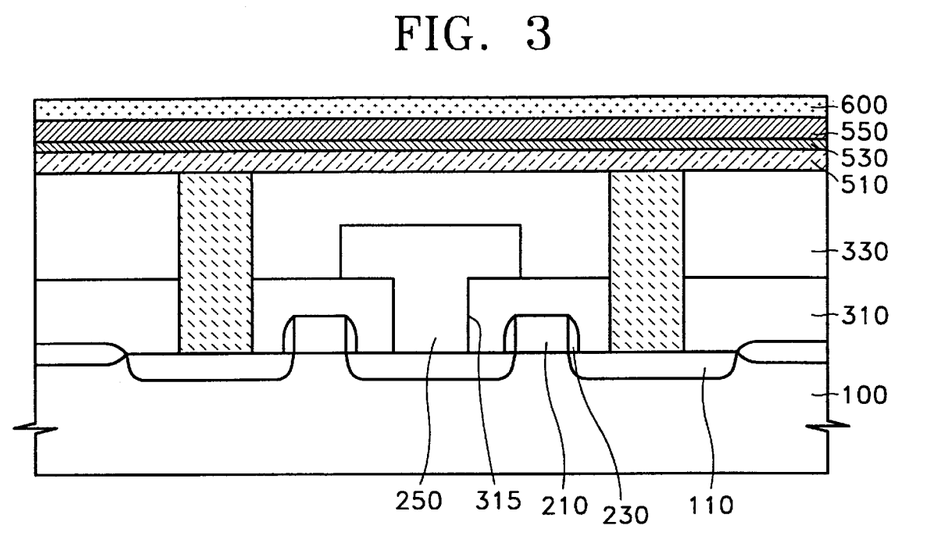

FIG. 3 schematically shows a step of forming a ferroelectric layer on the second lower metal layer 550. Specifically, a ferroelectric material is deposited over the second lower metal layer 550 of the lower electrode layer. For example, SrBi2Ta2O9 (SBT) family ferroelectric materials or PZT family ferroelectric materials are deposited to form a ferroelectric layer 600. For example, PZT is deposited to a thickness of approximately 2,000 Å to use it as the ferroelectric layer 600. In this case, it is more suitable to form the ferroelectric layer 600 of a PZT family ferroelectric material for forming an one-transistor one-capacitor ("1T1C") cell structure rather than a SBT family ferroelectric material. This is because the PZT material affects little the characteristics of an underlying complementary metal-oxide-semiconductor (CMOS) device because the deposition temperature thereof is 600–700° C. and the remnant polarization value of PZT is greater than about 30 $\mu C/cm^2$.

After forming the ferroelectric layer 600 as described above, a crystallization process is performed for crystallization of the ferroelectric layer 600. For example, the ferroelectric layer 600 is crystallized at approximately 700° C. for 5 minutes in an oxygen ambient in a rapid thermal annealing (RTA) equipment or a furnace equipment.

Figure 4:
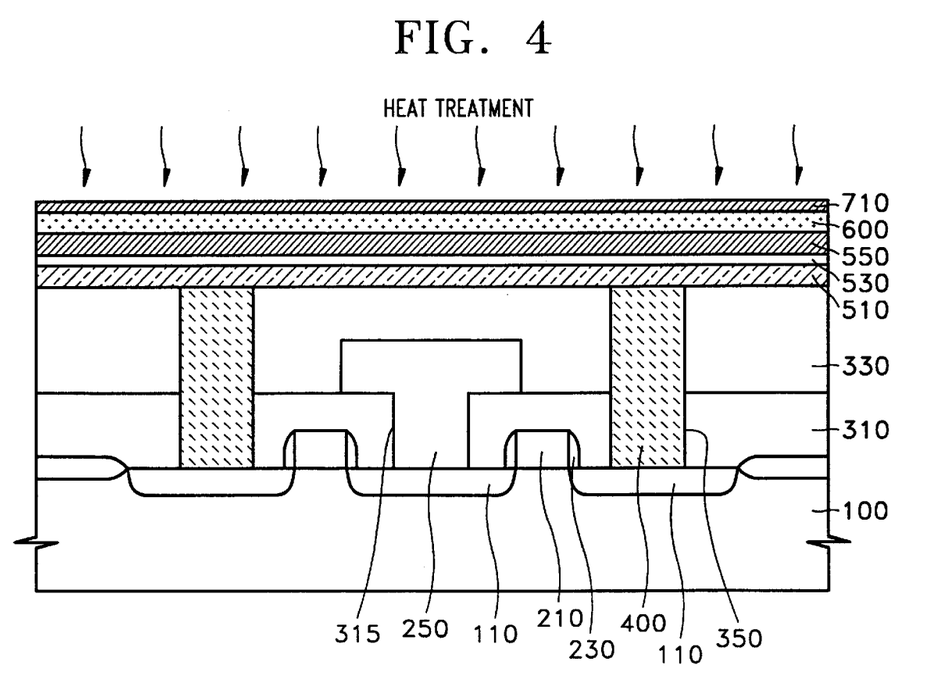

FIG. 4 schematically shows a step of forming a first upper metal layer on the ferroelectric layer 600. Specifically, as described in the step of forming the second lower metal layer 550 shown in FIG. 3, in order to improve the retention property of a semiconductor device, a first upper metal layer 710 is formed on the ferroelectric layer 600. For example, platinum may be deposited by sputtering to a thickness of approximately 500 Å. The first upper metal layer 710 is introduced in order to induce interface lattice matching or interface coherence at an interface with the ferroelectric layer 600, as described in connection with the formation of the second lower metal layer 550. By inducing interface lattice matching, the occurrence of interface states can be suppressed, and degradation of the retention property due to generation of space charges can be prevented.

Then, a platinum layer, used as the upper metal layer 710, is subjected to a heat treatment, in order to minimize interface defects by maximizing lattice matching between PZT, preferably used as the ferroelectric layer 600, and platinum, preferably used as the first upper metal layer 710 or the second lower metal layer 550. As described above, PZT, which is a ferroelectric material, may be relatively well matched to the platinum in terms of lattice matching and the orientation of crystal growth. Furthermore, with respect to thin film growth characteristic, the PZT has a heterogeneous growth characteristic in which the orientation of its crystal lattice growth is determined depending on the orientation of the crystal lattice of the underlying layer, i.e., platinum layer of the second lower metal layer 550. Thus, through the heat treatment as described above, lattice matching at the interface between the second lower metal layer 550 and the ferroelectric layer 600 or between the ferroelectric layer 600 and the first upper metal layer 710 can be improved. Thus, interface defect may be minimized to improve the retention property.

In this case, the heat treatment is performed preferably above the crystallization temperature of a ferroelectric material for the ferroelectric layer 600 such as PZT. This improves interface lattice matching by facilitating atomic migration of the ferroelectric material such as PZT by substantially increasing the distance between atoms at the interface. For example, the heat treatment may be performed at approximately 725–800° C. in an oxygen ambient using a rapid thermal process (RTP). Preferably, the heat treatment is performed at about 725° C. in an oxygen ambient for 30 seconds.

Figure 5:
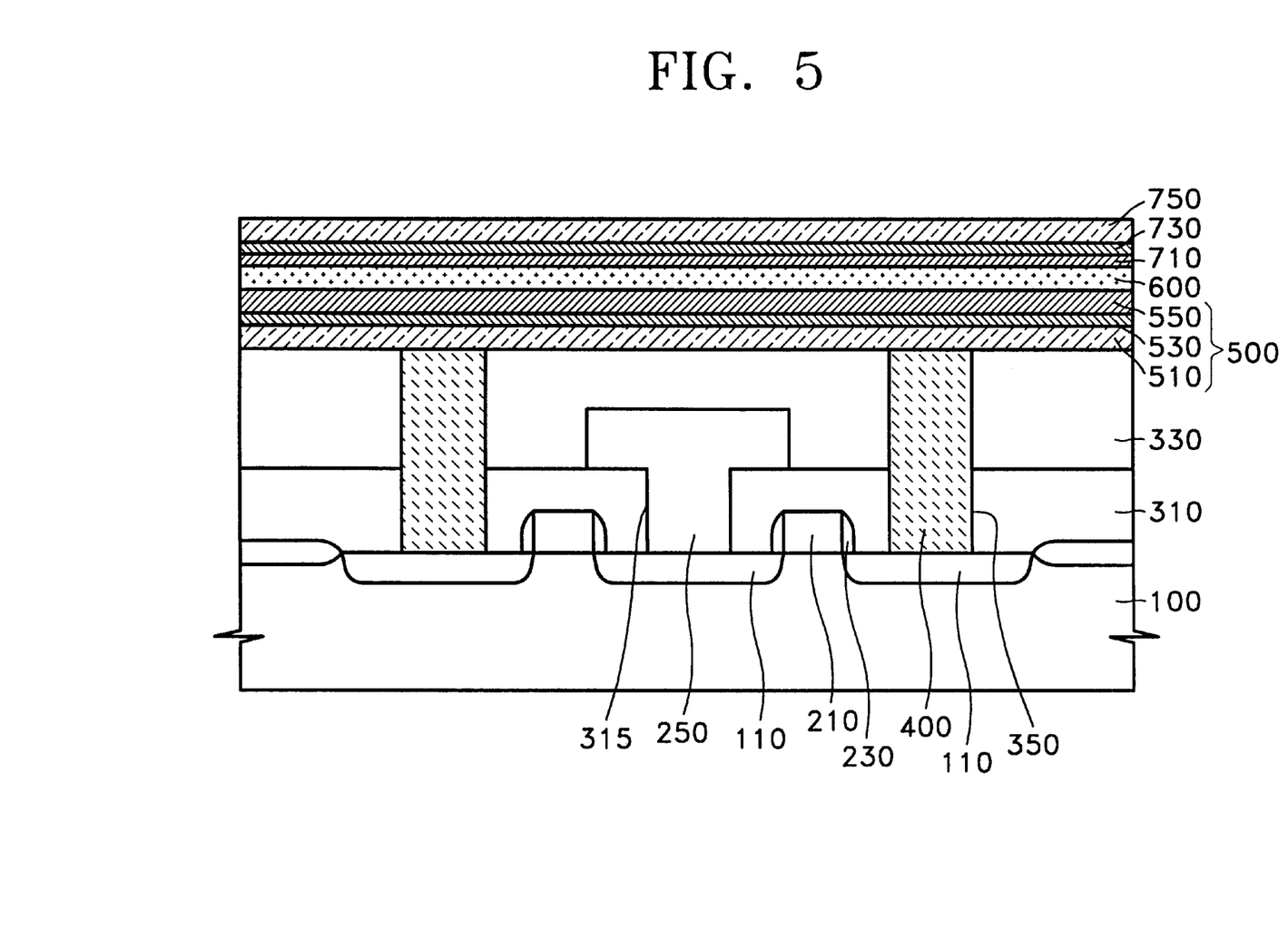

FIG. 5 schematically shows sequential formation of an upper metal oxide layer 730 and a second upper metal layer 750. Specifically, the upper metal oxide layer 730 for improving read/write endurance characteristics is formed on the first upper metal layer 710 for inducing interface lattice matching. As described in the step of forming the lower metal oxide layer 530, when oxygen vacancies occur at the interface of the ferroelectric layer 600, the upper metal oxide layer 730 compensates the oxygen vacancies. Thus, as described above, the upper metal oxide layer 730 may be formed of noble metal oxide such as rhenium oxide, ruthenium oxide, or rhodium oxide, preferably, iridium oxide.

For example, iridium oxide is deposited preferably by DC magnetron sputtering to a thickness of approximately 300 Å to form the upper metal oxide layer 730. Then, the iridium is heat treated in an oxygen ambient at 450° C. for approximately 30 minutes for stabilization of the iridium oxide layer, and then is annealed. In this case, the heat treatment may be performed using a furnace.

Subsequently, the second upper metal layer 750 is formed on top of the upper metal oxide layer 730. The second upper metal layer 750 prevents the diffusion of a material as described in the step of forming the first lower metal layer 510, and may be formed of a noble metal such as rhenium, rhodium, or ruthenium, preferably, iridium. For example, an iridium layer is formed by sputtering to a thickness of approximately 1,200 Å to use the iridium layer as the second upper metal layer 750. In this way, an upper electrode of a capacitor comprised of the first upper metal layer 710/upper metal oxide layer 730/second upper metal layer 750 is formed.

Figure 6:
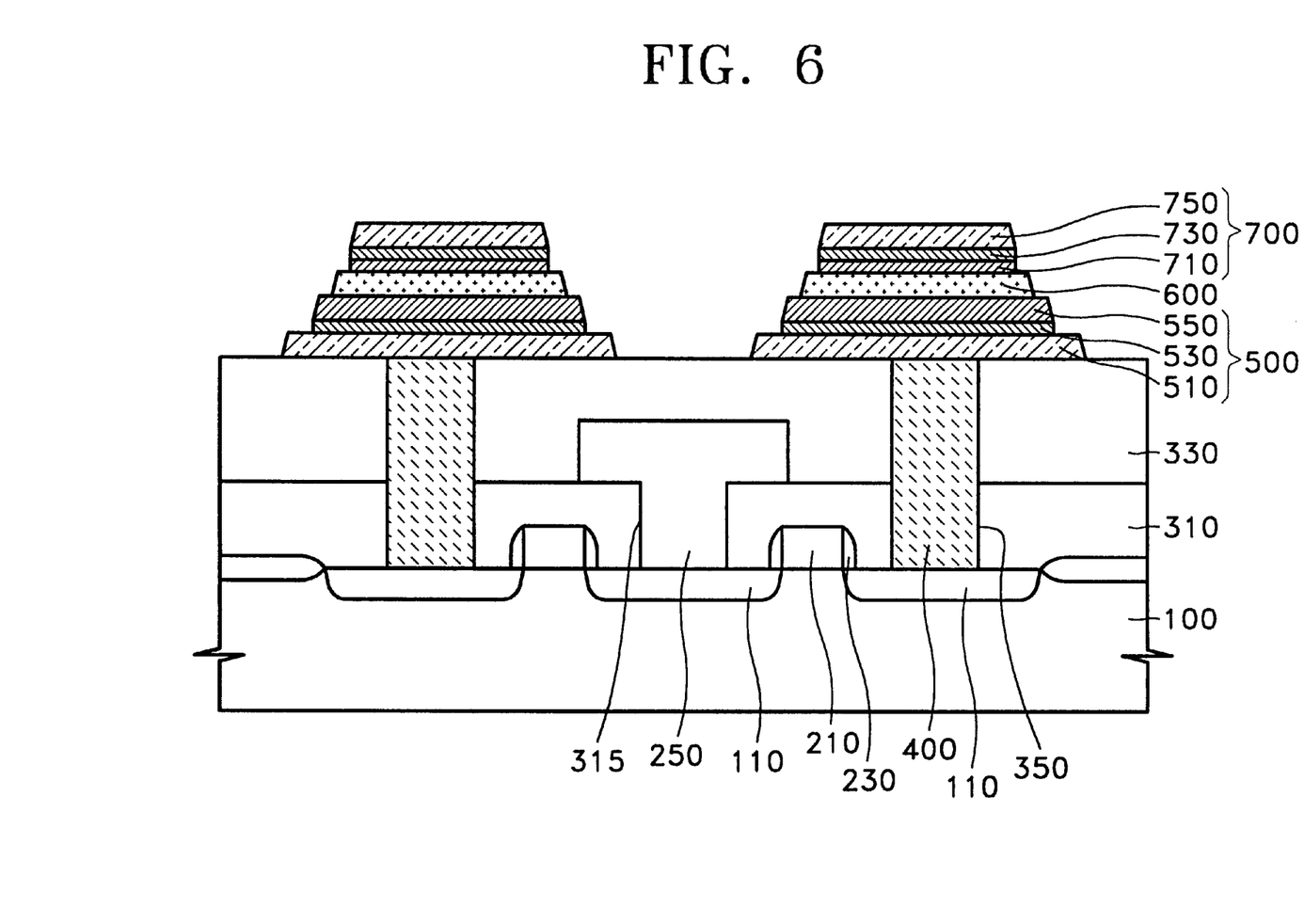

FIG. 6 schematically shows forming a ferroelectric capacitor including an upper electrode 700, a ferroelectric layer 600, and a lower electrode 500. Specifically, the second upper metal layer 750, the upper metal oxide layer 730, the first upper metal layer 710, the ferroelectric layer 600, the second lower metal layer 550, the lower metal oxide layer 530, and the first lower metal layer 510 are sequentially patterned. For example, a patterning process is performed using photolithography to separate a ferroelectric capacitor including the lower electrode 500, the ferroelectric layer 600, and the upper electrode 700 on a cell-by-cell basis.

Figure 7:
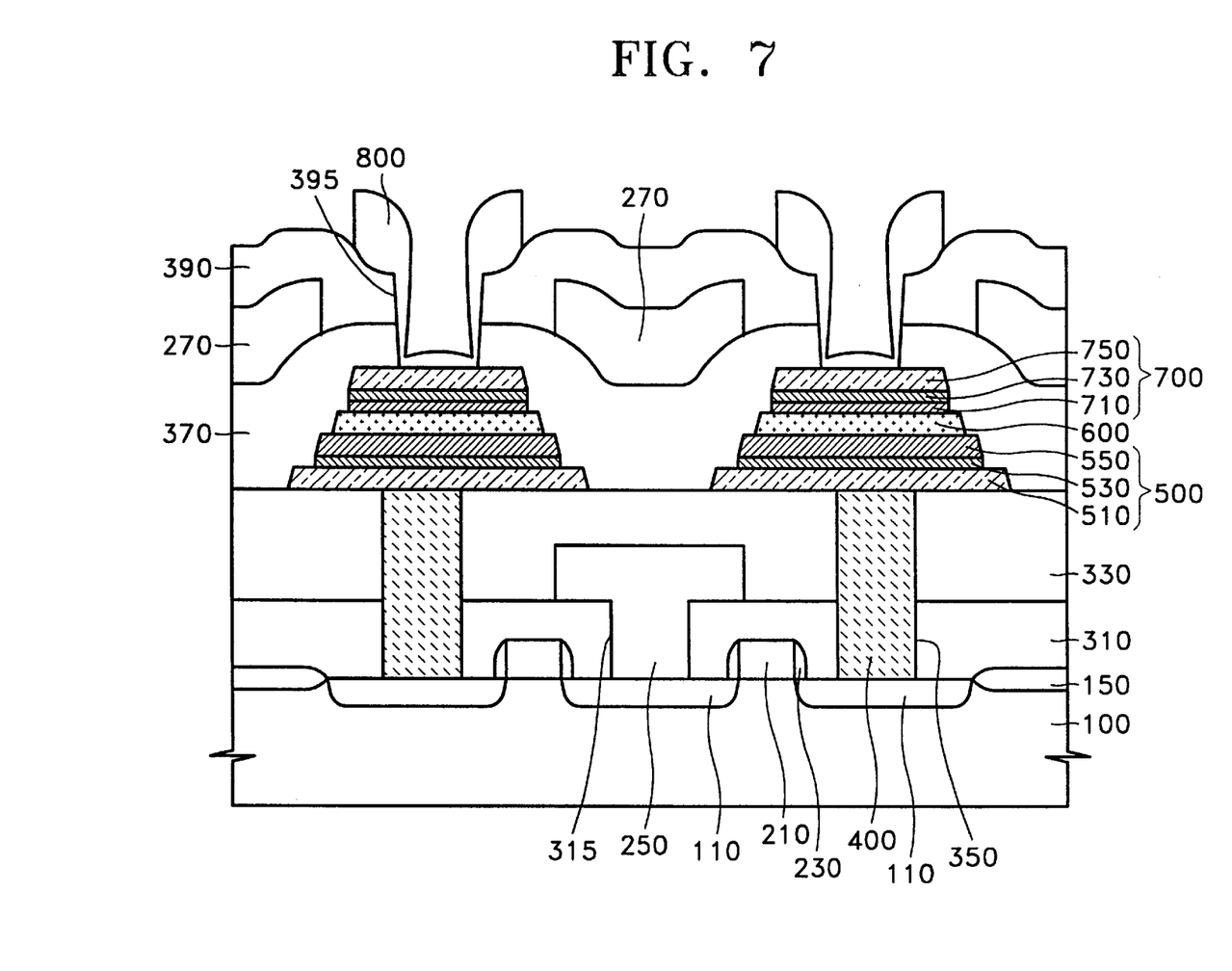

FIG. 7 schematically shows a step of forming an upper wire electrically connected to the upper electrode 700. Specifically, a third insulating layer 370 overlying the capacitor is formed of various insulating materials such as silicon oxide, and a lower wire 270 is formed on top of the third insulating layer 370. The lower wire 270 may be formed of metal such as aluminum, tungsten, or copper. Then, after a fourth insulating layer 390 overlying the lower wire 270 is formed, the fourth insulating layer 390 is patterned by photolithography to form a third contact hole 395 therein to expose the upper electrode 700 of the capacitor, in particular, the surface of the second upper metal layer 750. Next, an upper wire 800 electrically connected to the upper electrode 700 of the capacitor through the second upper metal layer 750 exposed by the third contact hole 395 is formed. The upper wire 800 may be formed of a metal material such as aluminum or copper.

As described above, a semiconductor device according to the invention, exemplified as the ferroelectric random access memory (FRAM) device implementing the three metal wire layers and 1T1C, can improve the read/write endurance characteristics as well as the retention characteristics. This can be demonstrated by the measured results shown in FIGS. 8–11.

Figure 8:
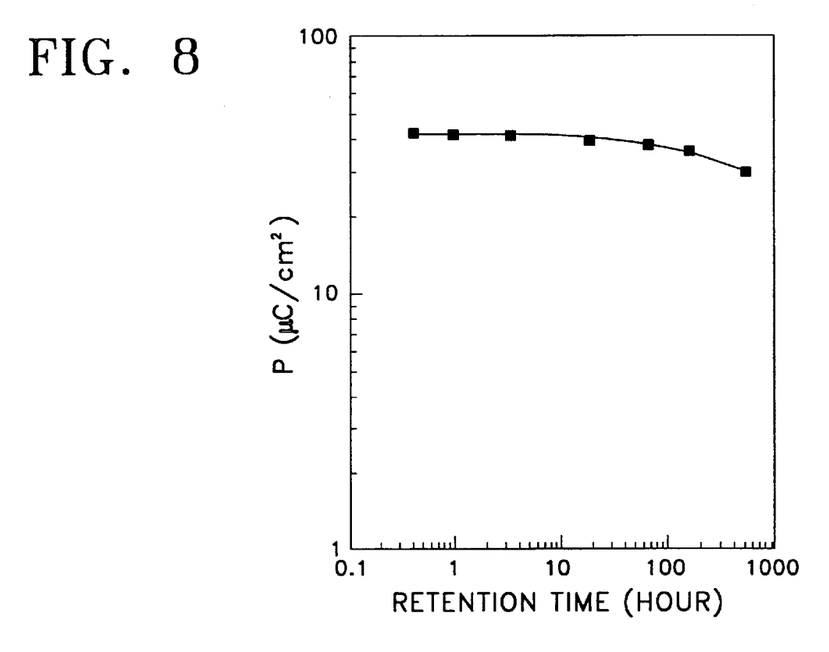
FIGS. 8–11 are graphs showing results measured for explaining the effect of the semiconductor device having the ferroelectric capacitor according to the embodiment of the invention.
Figure 9:
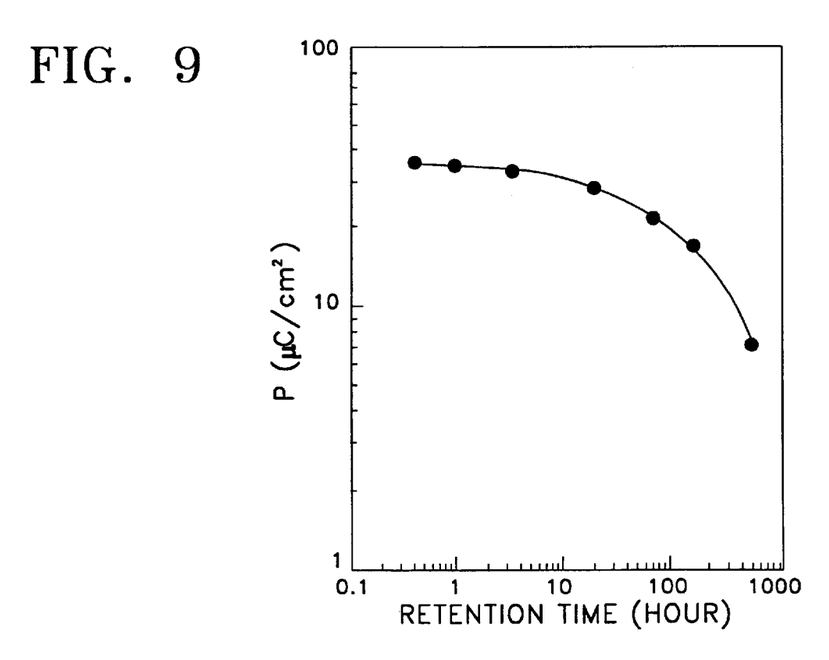

FIG. 8 shows the result of measuring the retention characteristics of an Ir/IrO$_2$/Pt/PZT/Pt/IrO$_2$/Ir ferroelectric capacitor according to the invention, and FIG. 9 shows the result of measuring the retention characteristics of an Ir/IrO$_2$/PZT/Pt/IrO$_2$/Ir ferroelectric capacitor. In order to evaluate the retention characteristics of the ferroelectric capacitor according to the invention, the Ir/IrO$_2$/Pt/PZT/Pt/IrO$_2$/Ir ferroelectric capacitor according to the embodiment of the invention was prepared and the result of measuring the retention characteristics thereof was shown in FIG. 8. Furthermore, for comparison, the Ir/IrO$_2$/PZT/Pt/IrO$_2$/Ir fer- roelectric capacitor was prepared and the result of measuring the retention characteristics thereof was shown in FIG. 9. In this case, the degree of polarization P ($\mu C/cm^2$) of the ferroelectric capacitor was measured under the condition of a high temperature of approximately 125° C.

When comparing the results shown in FIGS. 8 and 9, the Ir/IrO$_2$/Pt/PZT/Pt/IrO$_2$/Ir ferroelectric capacitor according to the embodiment of the invention exhibits excellent retention characteristics in which the degree of polarization P is improved by more than approximately 250% at 125° C. with the lapse of 100 hours, compared with the Ir/IrO2/PZT/Pt/IrO2/Ir ferroelectric capacitor.

Figure 10:
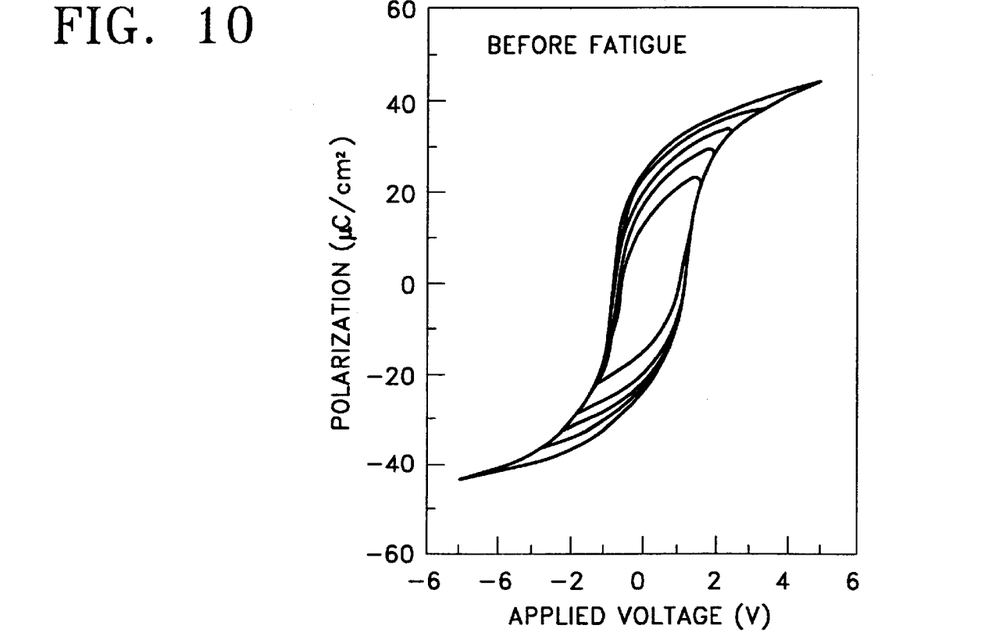
Figure 11:
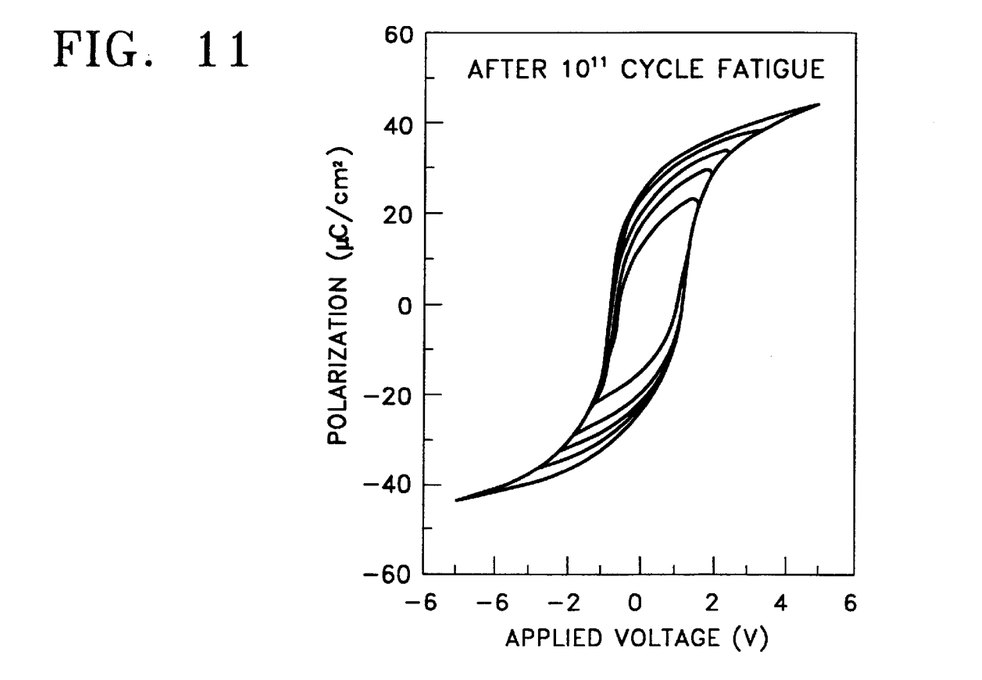

FIGS. 10 and 11 show the results of measuring the endurance characteristics of the Ir/IrO$_2$/Pt/PZT/Pt/IrO$_2$/Ir ferroelectric capacitor according to the embodiment of the invention. Specifically, after 1 MHz, 3.3V bipolar pulse was applied to the Ir/IrO$_2$/Pt/PZT/Pt/IrO$_2$/Ir ferroelectric capacitor according to the embodiment of the invention at 1011 fatigue cycles, non-volatile hysteretic characteristics were measured in terms of the degree of polarization in the range of 1.5–5.0 V in units of 0.5 V. FIGS. 10 and 11 show hysteresis curves before and after the capacitor was subjected to fatigue, respectively.

As shown in FIGS. 10 and 11, there is no substantial difference between the hysteresis curve of FIG. 11 after the fatigue was applied and that of FIG. 10 before the fatigue was applied. This demonstrates that the Ir/IrO$_2$/Pt/PZT/Pt/IrO$_2$/Ir ferroelectric capacitor according to the embodiment of the invention can realize excellent read/write endurance characteristics.

A ferroelectric capacitor according to the invention as described above can significantly improve the endurance and retention characteristics at the same time. Thus, a semiconductor device including a ferroelectric capacitor such as a ferroelectric memory device of a 1T1C cell structure having excellent operational characteristics can be provided.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of manufacturing a semiconductor device including a ferroelectric capacitor, comprising:

forming a conductive plug within a first insulating layer on a semiconductor substrate to be electrically connected to the semiconductor substrate;

forming a first lower metal layer which is electrically connected to the conductive plug and prevents diffusion of oxygen into the conductive plug on the first insulating layer;

forming a lower metal oxide layer on the first lower metal layer;

forming a second lower metal layer, for inducing interface lattice matching, on top of the lower metal oxide layer, thereby forming a lower electrode layer comprised of the first lower metal layer, the lower metal oxide layer, and the second lower metal layer, forming a ferroelectric layer from a ferroelectric material on the lower electrode layer at a crystallizing temperature of approximately 700° C.;

forming a first upper metal layer, for inducing interface lattice matching, on top of the ferroelectric layer;

inducing interface lattice matching at the interfaces between the first upper metal layer and the ferroelectric layer, and between the second lower metal layer and the ferroelectric layer by performing a heat treatment at a temperature higher than the crystallizing temperature after forming the first upper metal layer;

forming an upper metal oxide layer on top of the first upper metal layer; and forming a second upper metal layer, for preventing diffusion of a material, on top of the upper metal oxide layer, thereby forming an upper electrode layer comprised of the first upper metal layer, the upper metal oxide layer, and the second upper metal layer.

2. The method of claim 1, further comprising:

forming a second insulating layer on top of the upper electrode layer;

patterning the second insulating layer to form a contact hole therein; and forming a wire electrically connected to the upper electrode layer exposed through the contact hole.

3. The method of claim 1, which further comprises forming an adhesive layer made of a titanium layer under the first lower metal layer.

4. The method of claim 1, wherein the first lower metal layer is formed of ruthenium, rhenium or rhodium, and wherein the second upper metal layer is formed of ruthenium, rhodium, or rhenium.

5. The method of claim 1, wherein the first lower metal layer and the second upper metal layer are formed of iridium.

6. The method of claim 1, wherein the lower metal oxide layer is formed of iridium oxide, ruthenium oxide, rhenium oxide, or rhodium oxide, and wherein the upper metal oxide layer is formed of iridium oxide, ruthenium oxide, rhenium oxide, or rhodium oxide.

7. The method of claim 6, wherein the lower metal oxide layer and the upper metal oxide layer are formed of iridium oxide.

8. The method of claim 1, further comprising, after forming the lower metal oxide layer, performing a heat treatment on the lower metal oxide layer.

9. The method of claim 1, wherein the second lower metal layer and the first upper metal layer are formed of platinum.

10. The method of claim 1, wherein the ferroelectric layer is formed of a SrBi$_2$Ta$_2$O$_9$ (SBT) family or a Pb(Zr1−xTix)O$_3$ (PZT) family ferroelectric material.

11. The method of claim 1, wherein the ferroelectric layer is formed of PZT.

12. The method of claim 1, wherein the heat treatment for inducing the interface lattice matching is performed at a range of approximately 725–800° C.

13. The method of claim 1, wherein the heat treatment for inducing the interface lattice matching is performed in an oxygen ambient.

14. The method of claim 1, further comprising, after forming the upper metal oxide layer, performing a heat treatment on the upper metal oxide layer.

15. A method of manufacturing a semiconductor device including a ferroelectric capacitor, the method comprising:

providing a semiconductor substrate with a first insulating layer formed on the semiconductor substrate;

forming a first lower metal layer being electrically connected to the substrate;

forming a conductive lower metal oxide layer on the first lower metal layer;

forming a second lower metal layer for inducing interface lattice matching on top of the lower metal oxide layer, thereby forming a lower electrode layer including the first lower metal layer, the lower metal oxide layer, and the second lower metal layer.

forming a ferroelectric layer on the lower electrode layer;

performing a crystallizing heat-treatment on the ferroelectric layer at a temperature of approximately 700° C.;

forming a first upper metal layer for inducing interface lattice matching on top of the ferroelectric layer;

performing another heat treatment above the temperature of the crystallizing heat-treatment, at a temperature range of approximately 725–800° C., to induce interface lattice matching at the interfaces between the first upper metal layer and the ferroelectric layer, and between the second lower metal layer and the ferroelectric layer;

forming a conductive upper metal oxide layer on top of the first upper metal layer; and forming a second upper metal layer for preventing diffusion of a material on top of the upper metal oxide layer to form an upper electrode layer comprised of the first upper metal layer, the upper metal oxide layer, and the second upper metal layer.

16. The method of claim 15, further comprising:

forming an upper insulating layer on top of the upper electrode layer;

patterning the upper insulating layer to form a contact hole therein; and forming a wire electrically connected to the upper electrode layer exposed through the contact hole.

* * * * *

UNITED STATES PATENT AND TRADEMARK OFFICE
CERTIFICATE OF CORRECTION

PATENT NO. : 6,727,156 B2
DATED : April 27, 2004
INVENTOR(S) : Jung et al.

It is certified that error appears in the above-identified patent and that said Letters Patent is hereby corrected as shown below:

<u>Title page, Item [54] and Column 1, lines 1-3,</u>
Title, SEMICONDUCTOR DEVICE INCLUDING FERROELECTRIC CAPACITOR AND METHOD OF MANUFACTURING THE SAME" should read
-- METHOD OF MANUFACTURING A SEMICONDUCTOR DEVICE INCLUDING FERROELECTRIC CAPACITOR --.

Signed and Sealed this

Ninth Day of November, 2004

JON W. DUDAS
*Director of the United States Patent and Trademark Office*